(12) United States Patent
Hashimoto

(10) Patent No.: US 11,700,014 B2
(45) Date of Patent: Jul. 11, 2023

(54) WEIGHT DATA COMPRESSION METHOD, WEIGHT DATA DECOMPRESSION METHOD, WEIGHT DATA COMPRESSION DEVICE, AND WEIGHT DATA DECOMPRESSION DEVICE

(71) Applicant: Socionext Inc., Kanagawa (JP)

(72) Inventor: Yoshinobu Hashimoto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/714,631

(22) Filed: Apr. 6, 2022

(65) Prior Publication Data
US 2022/0329259 A1 Oct. 13, 2022

(30) Foreign Application Priority Data
Apr. 13, 2021 (JP) ................. 2021-068040

(51) Int. Cl.
  *H03M 5/00* (2006.01)
  *H03M 7/30* (2006.01)
  *G06N 3/08* (2023.01)
  *H03M 7/46* (2006.01)

(52) U.S. Cl.
  CPC ............ *H03M 7/6011* (2013.01); *G06N 3/08* (2013.01); *H03M 7/6005* (2013.01); *H03M 7/70* (2013.01); *H03M 7/46* (2013.01)

(58) Field of Classification Search
  CPC .... H03M 7/6011; H03M 7/6005; H03M 7/70; H03M 7/46; H03M 7/3066; G06N 3/08; G06N 3/0495
  USPC ......................................................... 341/55
  See application file for complete search history.

(56) References Cited

U.S. PATENT DOCUMENTS 10,944,422 B1 * 3/2021 Seyedzadehdelcheh ................... H03M 7/3082
2018/0102788 A1 * 4/2018 Inoue .................. H03M 7/3066

OTHER PUBLICATIONS

Hyeonwook Wi et al., "Compressing Sparse Ternary Weight Convolutional Neural Networks for Efficient Hardware Acceleration", 2019 IEEE/ACM International Symposium on Low Power Electronics and Design (ISLPED).

* cited by examiner

*Primary Examiner* — Jean B Jeanglaude
(74) *Attorney, Agent, or Firm* — McDermott Will & Emery LLP

(57) ABSTRACT

A weight data compression method includes: generating a 4-bit data string of 4-bit data items each expressed as any one of nine 4-bit values, by dividing ternary weight data into data items each having 4 bits; and generating first compressed data including a first flag value string and a first non-zero value string by (i) generating the first flag value string by assigning one of 0 and 1 as a first flag value of a 1-bit flag to a 4-bit data item 0000 and assigning an other of 0 and 1 as a second flag value of the 1-bit flag to a 4-bit data item other than 0000 among the 4-bit data items in the 4-bit data string and (ii) generating the first non-zero value string by converting the 4-bit data item other than 0000 into a 3-bit data item having any one of eight 3-bit values.

14 Claims, 11 Drawing Sheets

|  | Comparative Example 1 | Comparative Example 2 | Embodiment 1 |
|---|---|---|---|
| Bit count of data before compression | A | A | A |
| Bit count of flag value string | A/2 | — | A/4 |
| Bit count of non-zero value string | 0 to A/2 | — | 0 to 3A/4 |
| Bit count of compressed data | A/2 to A | A/2 to 2A | A/4 to A |

| N-bit data string (N is integer greater than or equal to 2) | Number of variations of non-zero values | Bit count necessary for expressing non-zero values |
|---|---|---|
| 2 (Comparative Example 1) | 2 | 1 |
| 3 | 7 | 3 |
| 4 (Embodiment 1) | 8 | 3 |
| 5 | 31 | 5 |
| 6 | 26 | 5 |
| 7 | 127 | 7 |
| 8 | 80 | 7 |
| ⋮ | ⋮ | ⋮ |

WEIGHT DATA COMPRESSION METHOD, WEIGHT DATA DECOMPRESSION METHOD, WEIGHT DATA COMPRESSION DEVICE, AND WEIGHT DATA DECOMPRESSION DEVICE

CROSS REFERENCE TO RELATED APPLICATION

The present application is based on and claims priority of Japanese Patent Application No. 2021-068040 filed on Apr. 13, 2021. The entire disclosure of the above-identified application, including the specification, drawings and claims is incorporated herein by reference in its entirety.

FIELD

The present disclosure relates to a method of compressing weight data used in a neural network, a method of decompressing compressed weight data, a weight data compression device, and a weight data decompression device. The present disclosure particularly relates to the case where the weights are ternary weights which are data items each having any one of three 2-bit values.

BACKGROUND

Conventional neural networks frequently use convolutional operation, High-dimensional weight data serving as a weighting factor in the convolutional operation has a large bit count, thus straining a memory region in which the weight data is held and a bus band through which the weight data flows. In view of this, the weight data is compressed in order to reduce the bit count of the weight data before operation.

Non-Patent Literature (NPL) 1 discloses compression methods according to zero-value compression (ZVC) and run-length encoding (RLE) as examples of the method of compressing the ternary weight data.

CITATION LIST

Non Patent Literature

NPL 1: Compressing Sparse Ternary Weight Convolutional Neural Networks for Efficient Hardware Acceleration, Hyeonuk Wi, Hyeonuk Kim, Seungkyu Choi, and Lee-Sup Kim, 2019, IEEE/ACM International Symposium on Low Power Electronics and Design (ISLPED)

SUMMARY

Technical Problem

With the compression methods disclosed in NPL 1, the bit count of the ternary weight data can be reduced to some extent, but cannot be reduced any further.

In view of this, the present disclosure provides a weight data compression method and so on whereby the bit count of ternary weight data used in a neural network can be less than that of conventional techniques.

Solution to Problem

In order to provide the above weight data compression method and so on, a weight data compression method according to an aspect of the present disclosure is a weight data compression method of compressing ternary weight data used in a neural network, the weight data compression method including: generating a 4-bit data string by dividing the ternary weight data into data items each having 4 bits, the ternary weight data being a data string of data items each having any one of three 2-bit values, the 4-bit data string being a data string of 4-bit data items each expressed as any one of nine 4-bit values; and generating first compressed data including a first flag value string and a first non-zero value string by generating the first flag value string and the first non-zero value string, the first flag value string being generated by assigning one of 0 and 1 as a flag value of a 1-bit flag to a 4-bit data item 0000 and assigning an other (of 0 and 1) to a 4-bit data item other than 0000 among the 4-bit data items in the 4-bit data string, the first non-zero value string being generated by converting the 4-bit data item other than 0000 into a 3-bit data item having any one of eight 3-bit values.

In order to provide the above weight data compression method and so on, a weight data decompression method according to an aspect of the present disclosure is a weight data decompression method of decompressing the first compressed data compressed using the weight data compression method described above, the weight data decompression method including: converting 3-bit data items included in the first non-zero value string into 4-bit data items other than 0000, and arranging the 4-bit data items other than 0000; and generating the ternary weight data before compression by substituting 0000 for the flag value of the one of 0 and 1 included in the first flag value string and substituting a 4-bit data item included in the 4-bit data items other than 0000 for the flag value of the other of 0 and 1 in an order in which the 4-bit data items other than 0000 are arranged.

In order to provide the above weight data compression method and so on, a weight data compression device according to an aspect of the present disclosure is a weight data compression device including a compressor that compresses ternary weight data used in a neural network, wherein the compressor: generates a 4-bit data string by dividing the ternary weight data into data items each having 4 bits, the ternary weight data being a data string of data items each having any one of three 2-bit values, the 4-bit data string being a data string of 4-bit data items each expressed as any one of nine 4-bit values; and generates first compressed data including a first flag value string and a first non-zero value string by generating the first flag value string and the first non-zero value string, the first flag value string being generated by assigning one of 0 and 1 as a flag value of a 1-bit flag to a 4-bit data item 0000 and assigning an other (of 0 and 1) to a 4-bit data item other than 0000 among the 4-bit data items in the 4-bit data string, the first non-zero value string being generated by converting the 4-bit data item other than 0000 into a 3-bit data item having any one of eight 3-bit values.

In order to provide the above weight data compression method and so on, a weight data decompression device according to an aspect of the present disclosure is a weight data decompression device including a decompression circuit that decompresses the first compressed data compressed by the weight data compression device described above, wherein the decompression circuit: converts the first non-zero value string of 3-bit data items each having any one of eight 3-bit values into 4-bit data items other than 0000, and arranges the 4-bit data items other than 0000; and generates the ternary weight data before compression by substituting 0000 for the flag value of the one of 0 and 1 included in the first flag value string and substituting a 4-bit data item included in the 4-bit data items other than 0000 for the flag value of the other of 0 and 1 in an order in which the 4-bit data items other than 0000 are arranged.

Advantageous Effects

With the weight data compression method and so on according to the present disclosure, the bit count of ternary weight data used in a neural network can be less than that of conventional techniques.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 6:
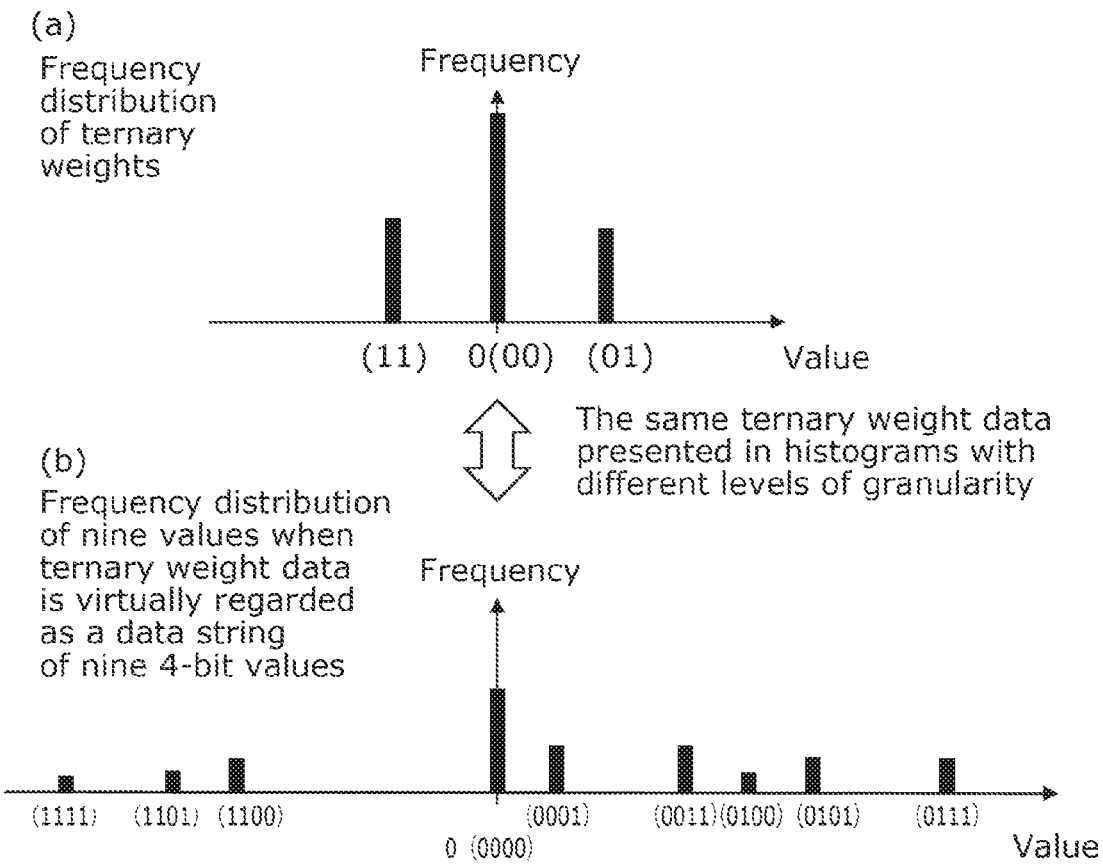

Part (a) of FIG. 6 is a diagram illustrating an example of frequency distribution of ternary weights each having any one of three 2-bit values, and part (b) of FIG. 6 is a diagram illustrating an example of frequency distribution of nine values when ternary weight data is virtually regarded as a data string of data items each having any one of nine 4-bit values.

Figure 7:
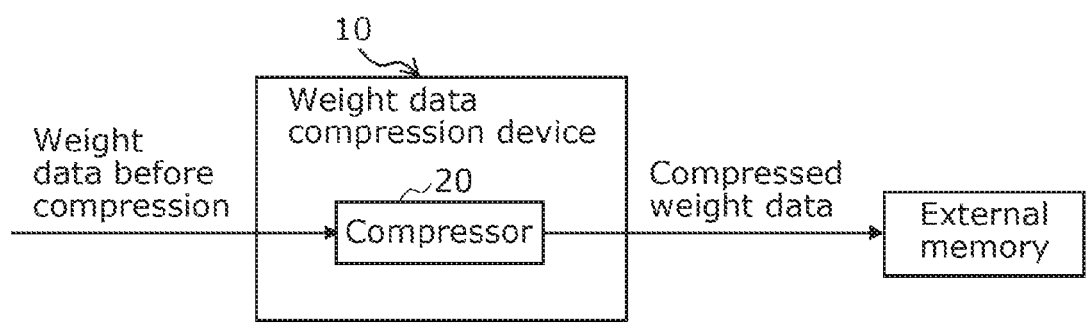

FIG. 7 is a block diagram illustrating an outline of a functional configuration of a weight data compression device according to Embodiment 1.

Figures 8, 9:
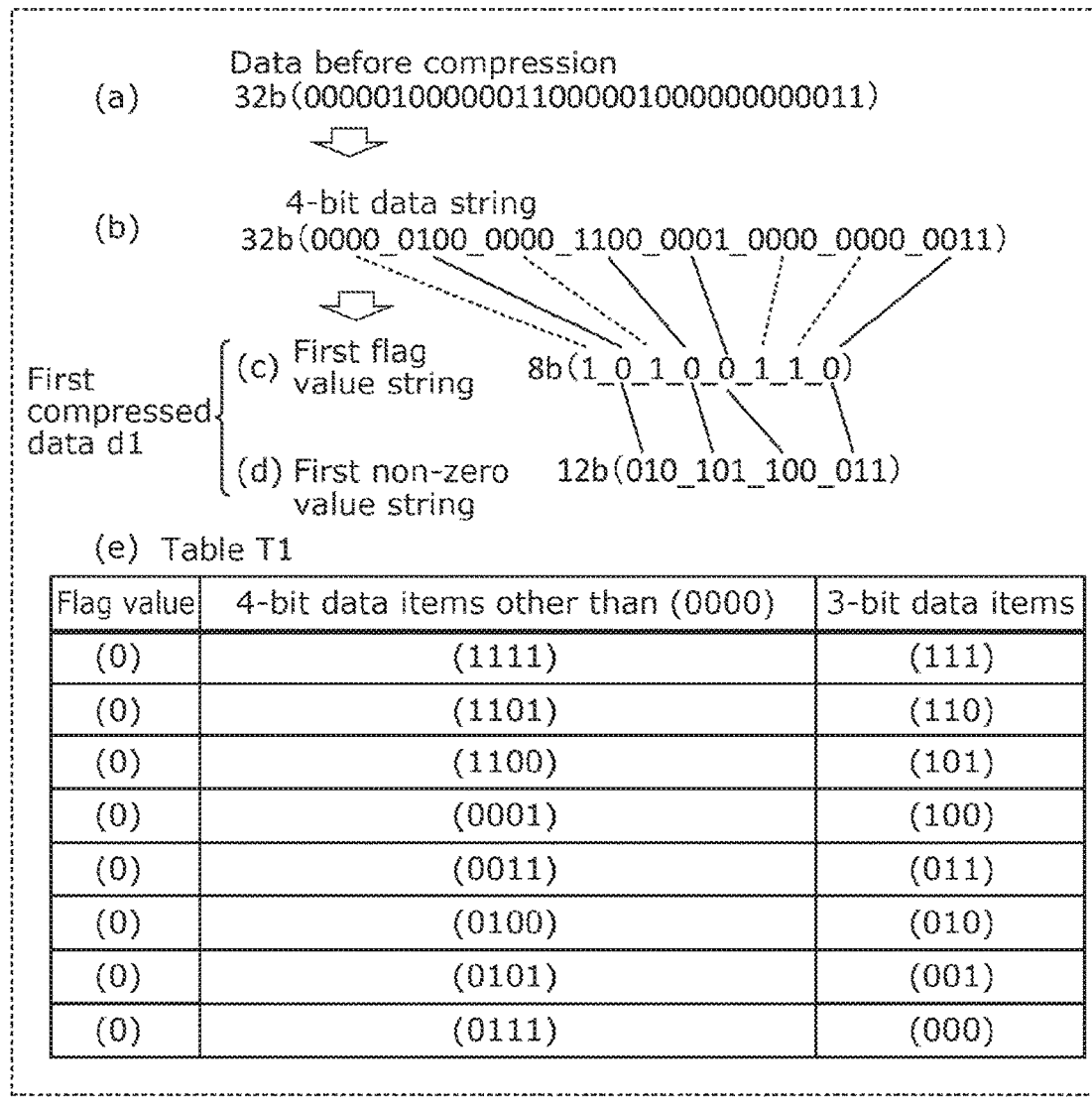

FIG. 8 is a diagram illustrating a process by which the weight data compression device according to Embodiment 1 compresses ternary weight data.

FIG. 9 is a diagram illustrating changes in bit count before and after compression of ternary weight data according to Embodiment 1 and Comparative Examples 1 and 2.

Figures 10, 11:
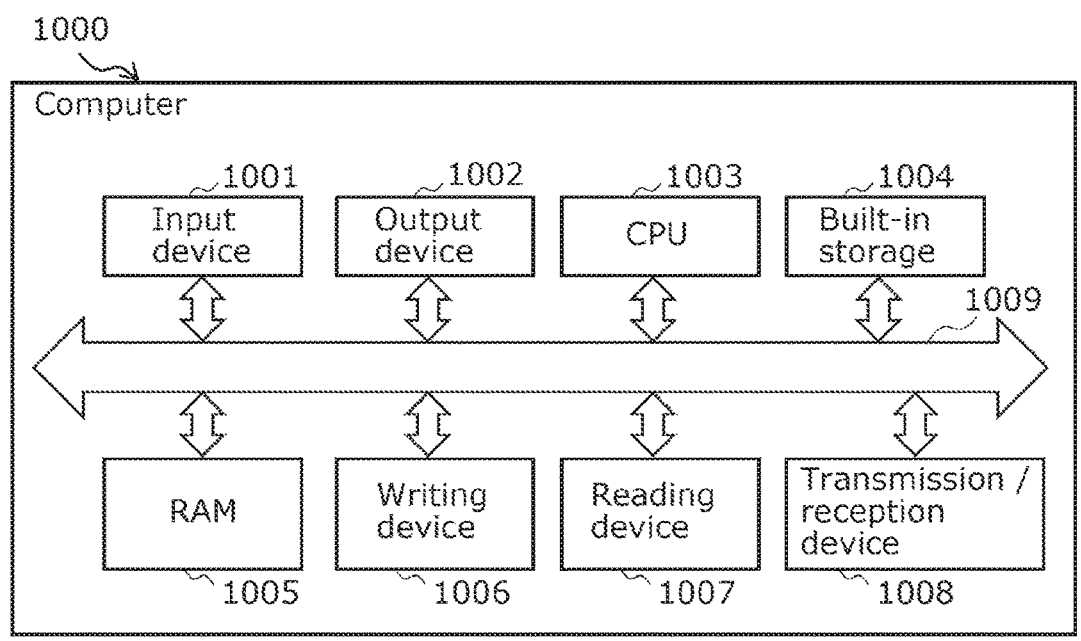

FIG. 10 is a diagram illustrating the bit count necessary for expressing non-zero values included in ternary weight data.

FIG. 11 is a diagram illustrating an example of a hardware configuration of a computer that implements, by software, functions of the weight data compression device according to Embodiment 1.

Figure 12:
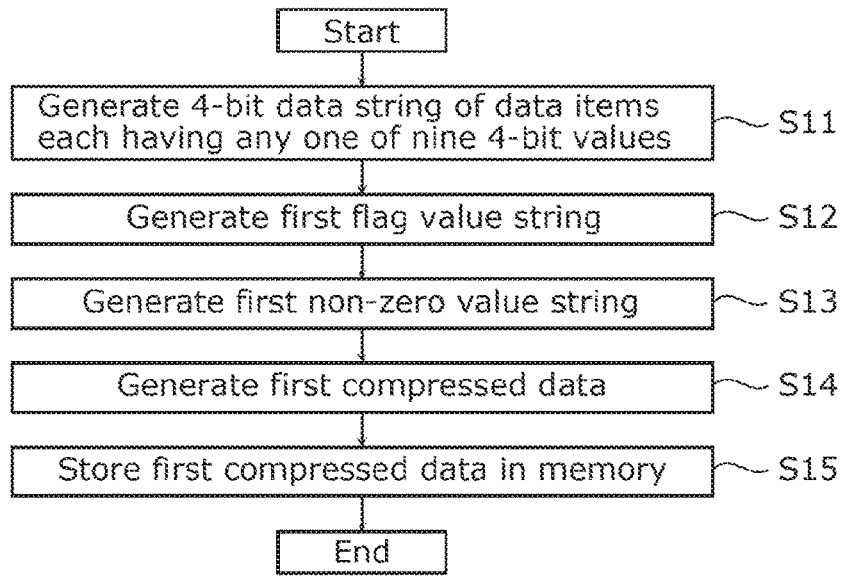

FIG. 12 is a flowchart illustrating a weight data compression method according to Embodiment 1.

Figure 13:
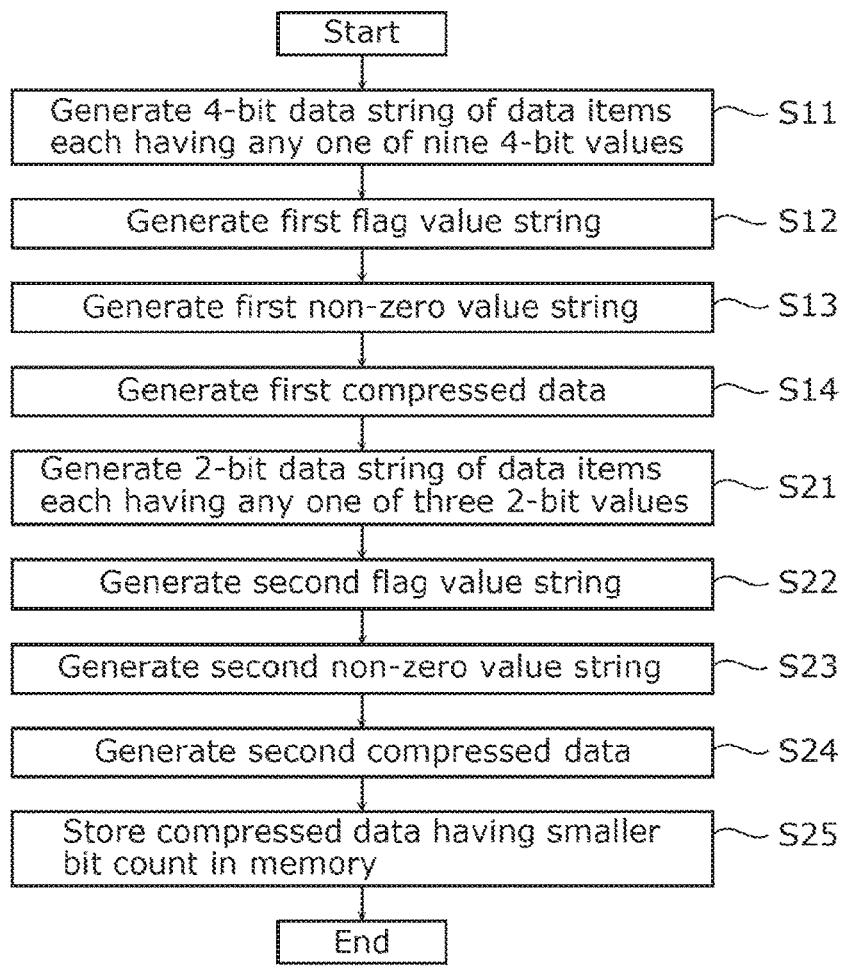

FIG. 13 is a flowchart illustrating a weight data compression method according to Variation 1 of Embodiment 1.

Figure 14:
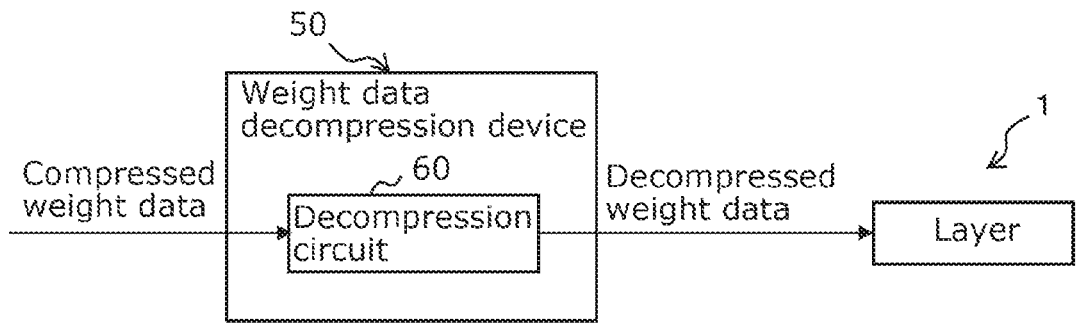

FIG. 14 is a block diagram illustrating an outline of a functional configuration of a weight data decompression device according to Embodiment 2.

Figure 15:
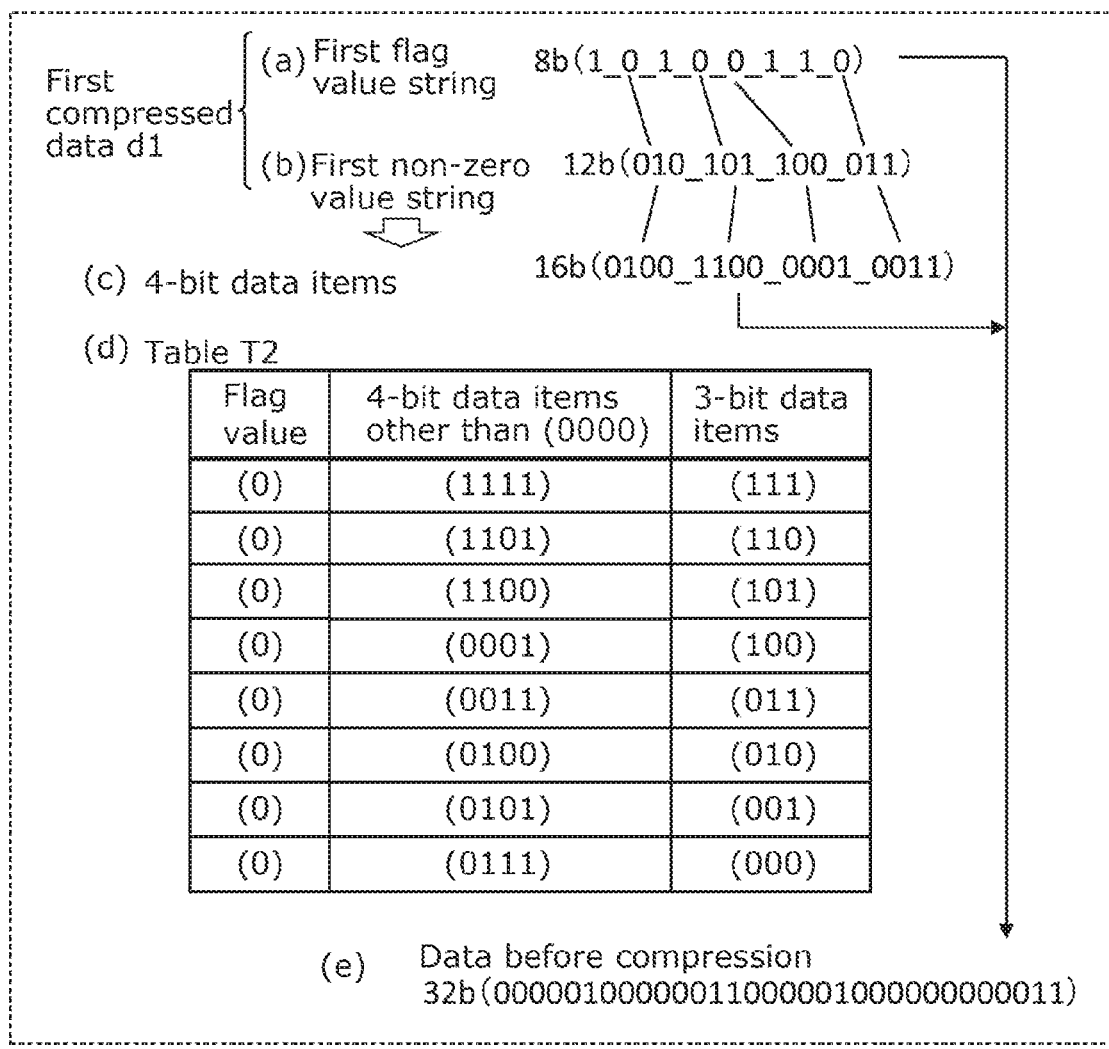

FIG. 15 is a diagram illustrating a process by which the weight data decompression device according to Embodiment 2 decompresses ternary weight data.

Figure 16:
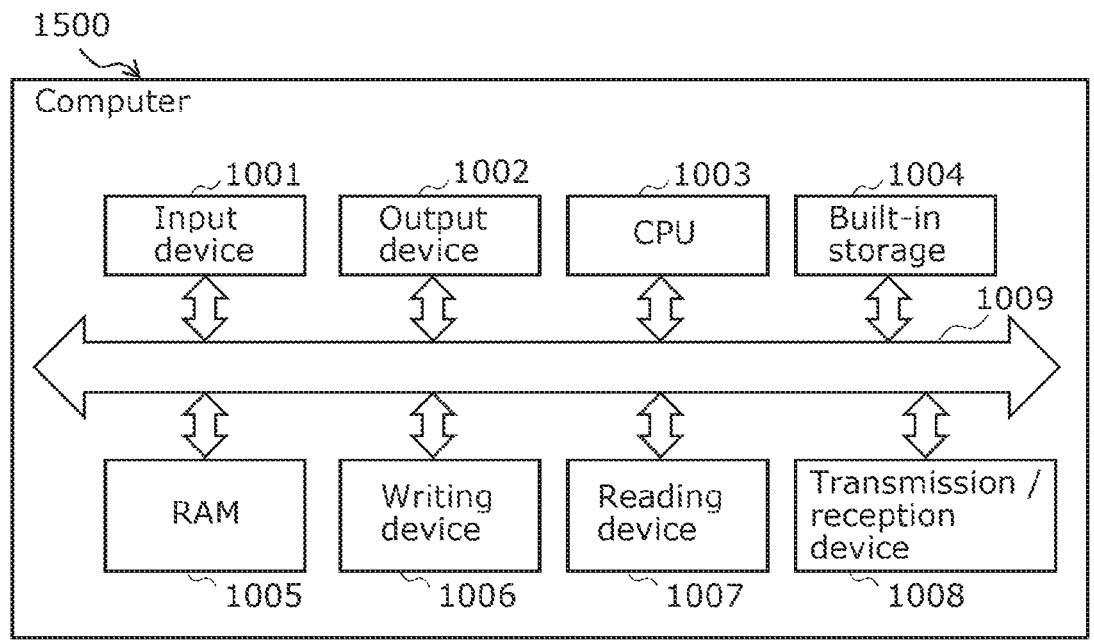

FIG. 16 is a diagram illustrating an example of a hardware configuration of a computer that implements, by software, functions of the weight data decompression device according to Embodiment 2.

Figure 17:
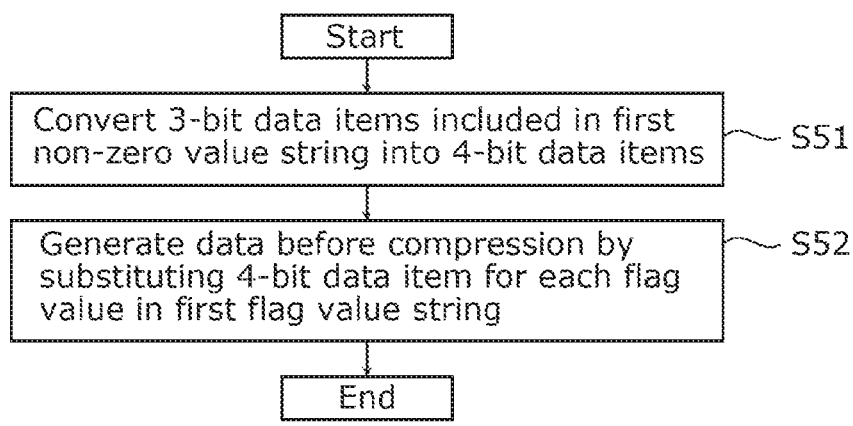

FIG. 17 is a flowchart illustrating a weight data decompression method according to Embodiment 2.

Figure 18:
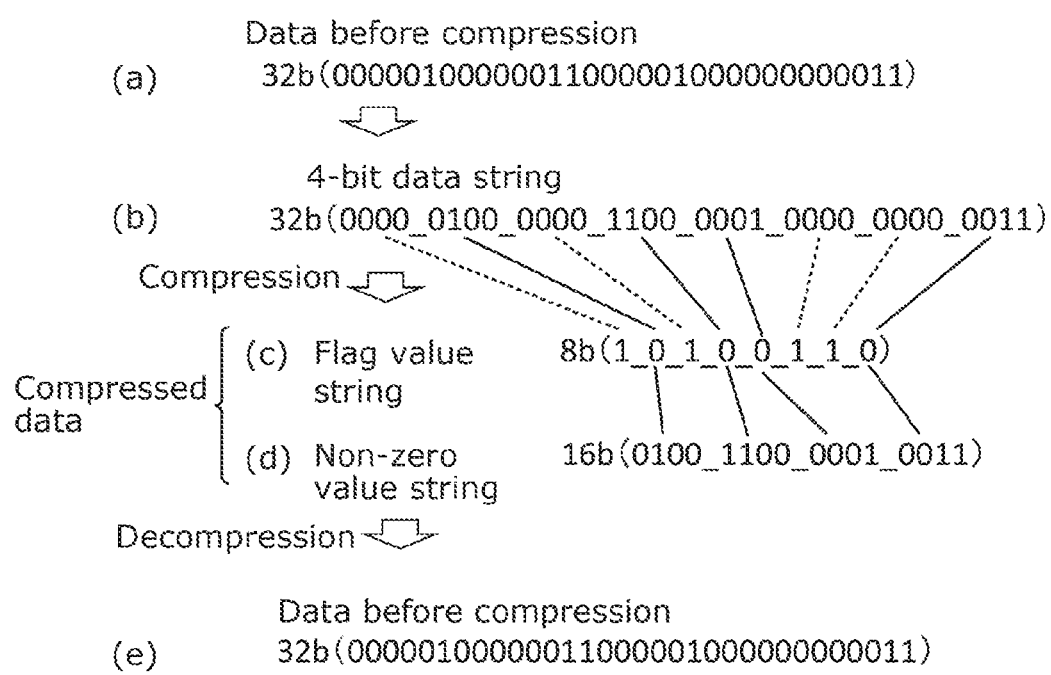

FIG. 18 is a diagram illustrating weight data compression processing and decompression processing performed in Embodiment 3.

Figure 19:
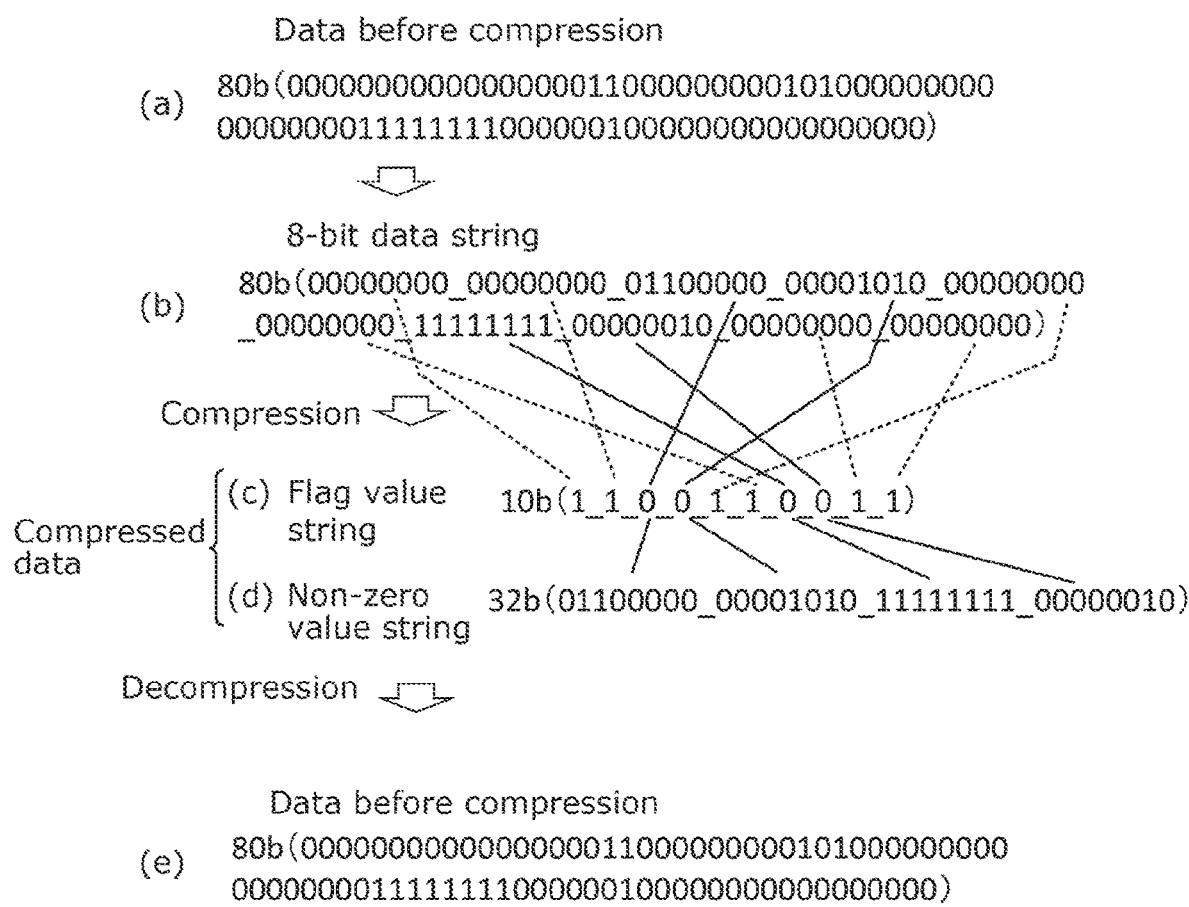

FIG. 19 is a diagram illustrating weight data compression processing and weight data decompression processing performed in Embodiment 4.

DESCRIPTION OF EMBODIMENTS

Background of the Present Disclosure

The background of the present disclosure will be described with reference to FIG. 1 through FIG. 5.

Figure 1:
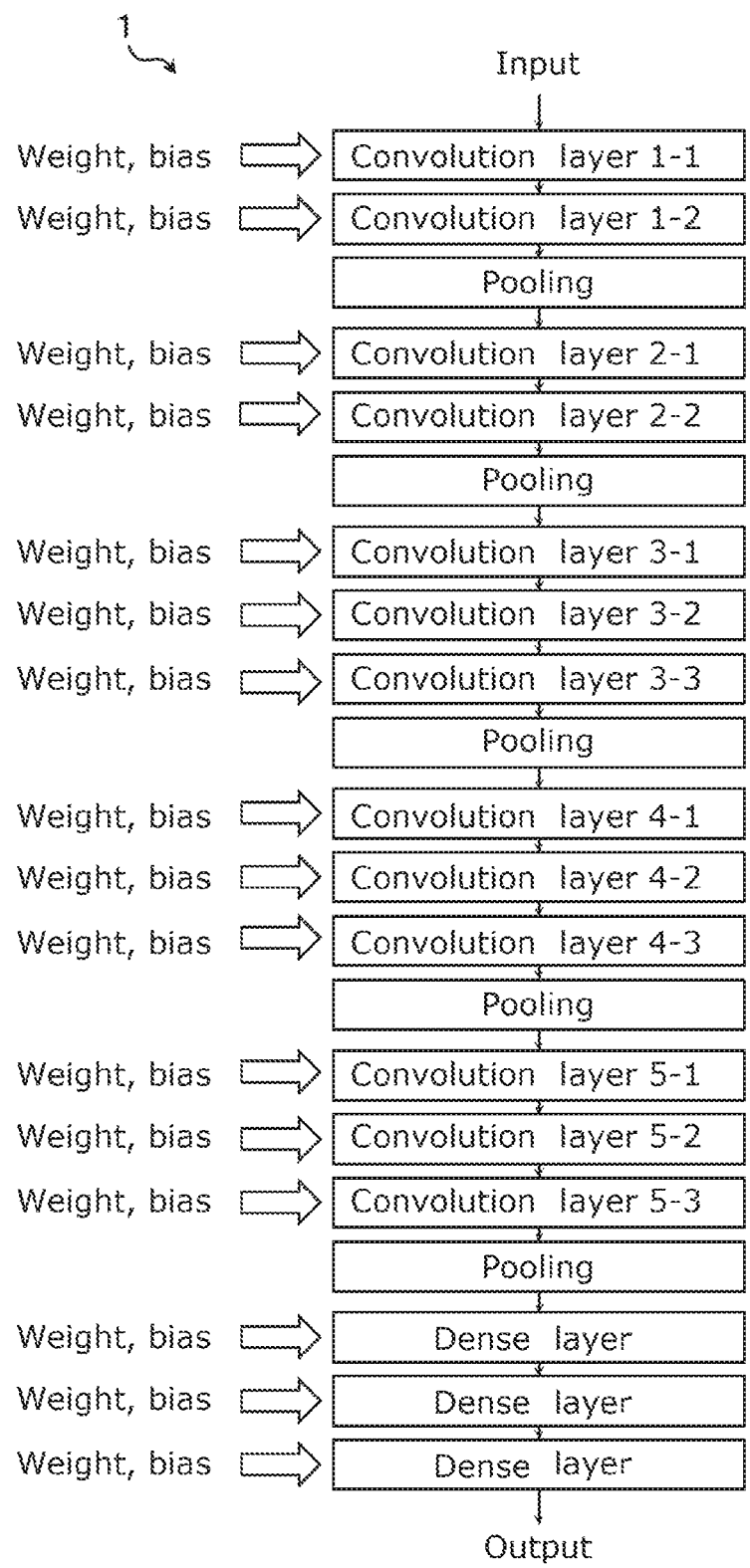
FIG. 1 is a diagram illustrating an example of a configuration of a convolutional neural network and positions in the configuration at which weight data is used.

FIG. 1 is a diagram illustrating an example of a configuration of convolutional neural network (CNN) 1 and positions in the configuration at which weight data is used.

Convolutional neural network 1 includes layers such as convolution layers and dense (fully connected) layers. For example, in each layer, a matrix operation is executed in which input data is multiplied by a weight and a bias is added. This matrix operation is executed by a semiconductor integrated circuit, and the data obtained from this operation processing is input to another layer.

In convolutional neural network 1 (hereinafter also referred to as neural network 1), compression is performed to reduce the bit count of the weight data used in neural network 1.

Figure 2:
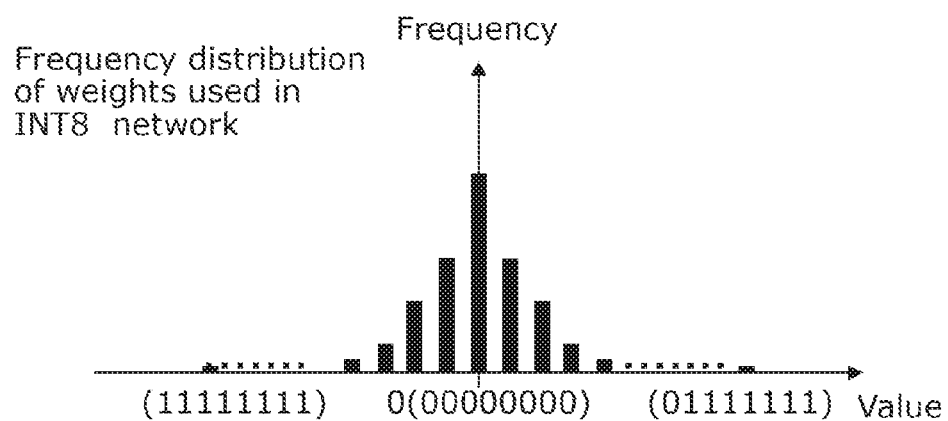
FIG. 2 is a diagram illustrating an example of frequency distribution of weights used in an INT8 (8-bit integer) network.

FIG. 2 is a diagram illustrating an example of frequency distribution of weights used in an INT8 (8-bit integer) network. FIG. 2 illustrates an example of frequency distribution of weights expressed as 256 8-bit values as weights used in an 8-bit integer network. With the weights illustrated in FIG. 2, 0 ((00000000) illustrated in FIG. 2) has the highest appearance frequency and the distribution tendency is symmetrical with respect to 0. In view of this, the weight data used in the 8-bit integer network is subject to data compression performed by utilizing the high appearance frequency of 0. Note that the reason why the appearance frequency of 0 is relatively high is largely due to the regularization commonly used to prevent over-training when training a neural network.

Figure 3:
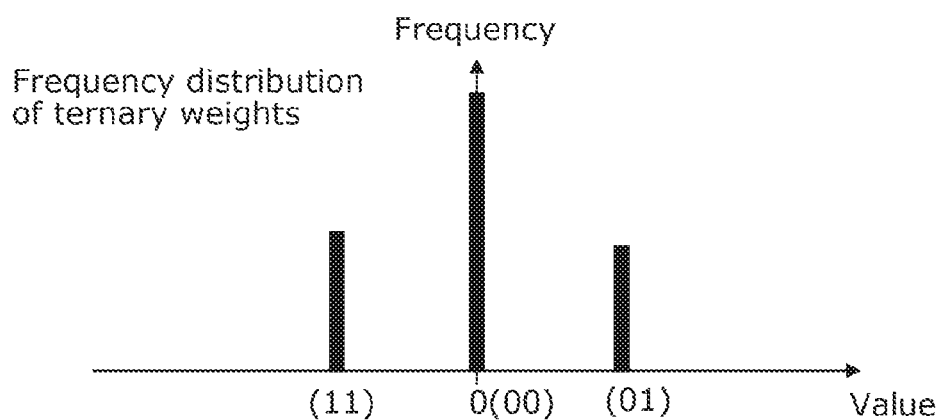
FIG. 3 is a diagram illustrating an example of frequency distribution of ternary weights.

FIG. 3 is a diagram illustrating an example of frequency distribution of ternary weights. FIG. 3 illustrates an example of frequency distribution of ternary weights used in a ternary network. Three 2-bit values are, for example, 2-bit data items 00, 01, and 11, and 10 is not included in this case. With the weight data illustrated in FIG. 3, too, 0 ((00) illustrated in FIG. 3) has the highest appearance frequency, and the distribution tendency is symmetrical with respect to 0. In view of this, the weight data used in the ternary network is also subject to data compression performed by utilizing the high appearance frequency of 0.

Figure 4:
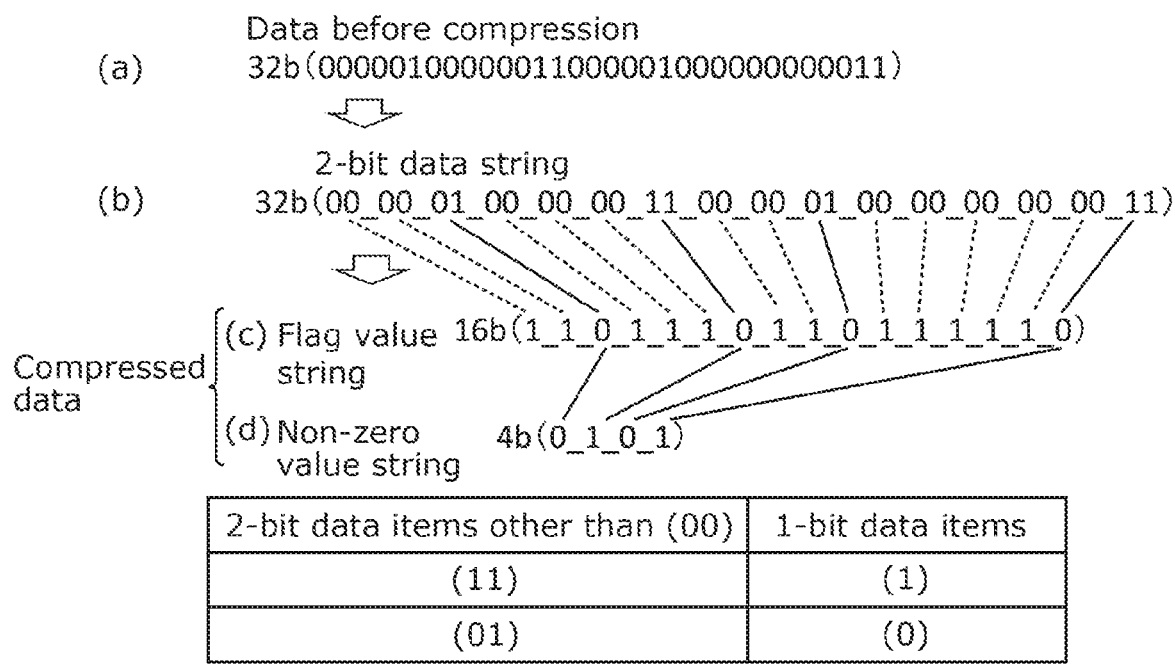
FIG. 4 is a diagram illustrating a process of compressing ternary weight data according to a weight data compression method of Comparative Example 1.

FIG. 4 is a diagram illustrating a process of compressing ternary weight data according to a weight data compression method of Comparative Example 1. The weight data compression method of Comparative Example 1 is a compression method according to zero value compression (ZVC), and 2-bit data items included in the ternary weight data are compressed using two types of data formats.

Comparative Examples 1 and 2 and the embodiments below will describe an example in which ternary weight data before compression is 32-bit data consisting of 16 consecutive ternary weights each expressed as any one of three 2-bit values as shown below (see part (a) of FIG. 4).

32 b (00000100000011000001000000000011)

Note that "32 b" above indicates that the data in the parentheses is 32-bit data. Similarly, hereinafter, "nb" in the expression "nb (0000 . . . )" indicates that the data in parentheses is n-bit data (n is an integer greater than or equal to 2).

Dividing the above 32-bit data into data items each having 2 bits allows the 32-bit data to be expressed as the 2-bit data string shown below (see part (b) of FIG. 4).

32 b (00_00_01_00_00_00_11_00_00_00_00_00_00_00_00_11)

As a flag value of a 1-bit flag, (1) is assigned to the 2-bit data item (00), and (0) is assigned to each of the 2-bit data items other than (00) among the 2-bit data items in the above 2-bit data string. Doing so generates a flag value string of 16-bit data shown below (see part (c) of FIG. 4).

16 b (1_1_0_1_1_1_0_1_1_0_1_1_1_1_1_0)

The above 16-bit data shows that there is a zero value (00) at each position of flag value (1), and that there is a non-zero value, which is a 2-bit data item other than (00), at each position of flag value (0).

In Comparative Example 1, as a flag value of a 1-bit flag, (1) is assigned to the 2-bit data item (11), and (0) is assigned to the 2-bit data item (01) among the 2-bit data items other than (00). By doing so, a non-zero value string in which data items corresponding to 2-bit data items other than (00) are sequentially arranged is expressed as data shown below (see part (d) of FIG. 4).

4 b (0_1_0_1)

In Comparative Example 1, compressed data including the above flag value string and non-zero value string is generated in the above manner. The bit count after the compression is 16 bits+4 bits=20 bits, which is less than the bit count of the ternary weight data before compression.

Figure 5:
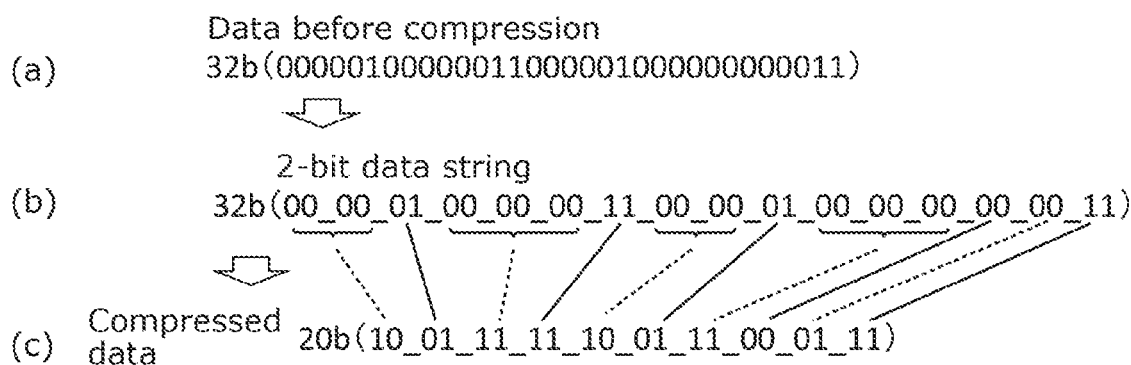
FIG. 5 is a diagram illustrating a process of compressing ternary weight data according to a weight data compression method of Comparative Example 2.

FIG. 5 is a diagram illustrating a process of compressing ternary weight data according to a weight data compression method of Comparative Example 2. The weight data compression method of Comparative Example 2 is a compression method according to run-length encoding (RLE), and data is compressed by utilizing the continuity of (00) among the 2-bit data items (00), (01), and (11) included in the ternary weight data.

This example also will describe an example in which ternary weight data before compression is 32-bit data consisting of 16 consecutive ternary weights each having any one of three 2-bit values, as shown below (see part (a) of FIG. 5).

32 b (00000100000011000001000000000011)

Dividing the above 32-bit data into data items each having 2 bits allows the 32-bit data to be expressed as a 2-bit data string as shown below (see part (b) of FIG. 5).

32 b (00_00_01_00_00_00_11_00_00_01_00_00_00_00_00_11)

In the above 2-bit data string, (01) appears after two consecutive appearances of (00), (11) appears after three consecutive appearances of (00), (01) appears after two consecutive appearances of (00), (00) appears after three consecutive appearances of (00), and (11) appears after one appearance of (00).

In Comparative Example 2, as a flag value of a 2-bit flag, (11) is assigned to the three consecutive appearances of (00), (10) is assigned to the two consecutive appearances of (00), and (01) is assigned to the one appearance of (00) as illustrated in part (c) of FIG. 5. Further, in Comparative Example 2, to data other than (00), the same data other than (00) is assigned as-is, and to data after three consecutive appearances of (00), the same data after three consecutive appearances of (00) is assigned as-is. By doing so, the above 32-bit data is expressed as data shown below (see part (c) of FIG. 5).

20 b (10_01_11_11_10_01_11_00_01_11)

This is how the above compressed data is generated in Comparative Example 2. The bit count after compression is 20 bits, which is less than the bit count of the ternary weight data before compression.

However, although the compression methods according to Comparative Examples 1 and 2 can reduce the bit count of the ternary weight data to some extent, the bit count cannot be reduced any further. In view of this, the weight data compression method according to the present disclosure has a configuration described below so that the bit count of the ternary weight data can be less than that of Comparative Examples 1 and 2.

Hereinafter, some exemplary embodiments of the present disclosure will be described in detail with reference to the accompanying drawings. Note that the embodiments described below each illustrate a specific example of the present disclosure. The numerical values, shapes, materials, standards, constituent elements, the arrangement and connection of the constituent elements, steps, the processing order of the steps, etc. illustrated in the embodiments below are mere examples, and do not intend to limit the present disclosure. Further, among the constituent elements in the following embodiments, constituent elements not recited in any one of the independent claims representing the most generic concepts of the present disclosure will be described as optional constituent elements. Furthermore, the drawings are not necessarily precise illustrations. In each figure, the same reference signs are given to essentially the same constituent elements, and redundant descriptions will be omitted or simplified.

Embodiment 1

[1-1. Weight Data Compression Device]

First, weight data handled in the present embodiment will be described.

Part (a) of FIG. 6 is a diagram illustrating an example of frequency distribution of ternary weights each having any one of three 2-bit values, and part (b) of FIG. 6 is a diagram illustrating an example of frequency distribution of nine values when the ternary weight data is virtually regarded as a data string of data items each having any one of nine 4-bit values. The graphs in parts (a) and (b) of FIG. 6 present the same ternary weight data in histograms of different levels of granularity.

As described above, the ternary weights are 2-bit data items 00, 01, and 11, and 10 is not included.

The nine 4-bit values are virtual 4-bit data items each concatenating two consecutive 2-bit ternary weights, and are taken into consideration only in the compression procedure and not used in the actual operation. Specifically, the nine 4-bit values are data items 0000, 0001, 0011, 0100, 0101, 0111, 1100, 1101, and 1111. The nine 4-bit values do not include the 2-bit data item not included in the three 2-bit values. In other words, the nine 4-bit values do not include 0010, 0110, 1110, 1000, 1001, 1010, and 1011 that use 10.

As illustrated in part (b) of FIG. 6, with the nine 4-bit values, too, the appearance frequency of 0 ((0000) illustrated in FIG. 6) is high as in the case of the three 2-bit values. Therefore, in the present embodiment, too, data compression is performed by utilizing the high appearance frequency of 0.

FIG. 7 is a block diagram illustrating an outline of a functional configuration of weight data compression device 10 according to Embodiment 1.

Weight data compression device 10 (hereinafter also referred to as data compression device 10) includes a processor such as a central processing unit (CPU) described later, volatile memory, non-volatile memory, and a program stored in the non-volatile memory. The functional configuration of data compression device 10 is implemented by executing the above program.

Data compression device 10 includes compressor 20 that compresses weight data used in neural network 1. The weight data used in neural network 1 is input to compressor 20, and compressor 20 generates compressed weight data (first compressed data d1 described later) by compressing the input weight data. The compressed weight data is stored in external memory. Hereinafter, processing performed by compressor 20 will be described.

FIG. 8 is a diagram illustrating a process by which weight data compression device 10 compresses the ternary weight data. When data compression device 10 performs data compression, the ternary weight data, which is a data string of data items each having any one of three 2-bit values, is virtually regarded as a data string of 4-bit data items each having any one of nine 4-bit values.

In the present embodiment, too, the ternary weight data, which is a data string of data items each having any one of three 2-bit values before compression, is assumed as follows (see part (a) of FIG. 8):
32 b (00000100000011000001000000000011)

Compressor 20 generates a 4-bit data string which is a data string of 4-bit data items each expressed as any one of nine 4-bit values shown below (see part (b) of FIG. 8), by dividing the ternary weight data, which is a data string of data items each having any one of three 2-bit values, into data items each having 4 bits.
32 b (0000_0100_00001100_0001_0000_0000_0011)

Compressor 20 determines, for each 4-bit data item included in the above 4-bit data string, whether the 4-bit data item is (0000), and compression is performed using a 1-bit flag and non-zero values corresponding to 8 types of 4-bit data items. Specifically, compressor 20 assigns one of (0) and (1) as a flag value of the 1-bit flag to a 4-bit data item (0000), and assigns the other (of (0) and (1)) to each of 4-bit data items other than (0000) among the 4-bit data items in the 4-bit data string. In the present embodiment, compressor 20 assigns (1) as a flag value to the 4-bit data item (0000), and assigns (0) as a flag value to each of 4-bit data items other than (0000). Doing so generates a first flag value string of 8-bit data shown below (see part (c) of FIG. 8).
8 b (1_0_1_0_0_1_1_0)

The above first flag value string shows that there is a zero value, i.e., the 4-bit data item (0000), at each position of flag value (1), and that there is a non-zero value, which is a 4-bit data item other than (0000), at each position of flag value (0).

Here, compressor 20 converts each of the 4-bit data items other than (0000) into a 3-bit data item based on table T1 illustrated in part (e) of FIG. 8. Table T1 is a table in which eight 4-bit data items other than (0000) are associated with 3-bit data items each having any one of eight 3-bit values, and is implemented in compressor 20. The eight 3-bit values are 3-bit data items 111, 110, 101, 100, 011, 010, 001, and 000.

Compressor 20 generates a first non-zero value string by converting each of the 4-bit data items other than (0000) into a 3-bit data item based on table T1. Specifically, (111) is assigned to (1111), (110) is assigned to (1101), (101) is assigned to (1100), (100) is assigned to (0001), (011) is assigned to (0011), (010) is assigned to (0100), (001) is assigned to (0101), and (000) is assigned to (0111) among the 4-bit data items other than (0000), By doing so, the non-zero values included in the 32-bit data are expressed as the first non-zero value string shown below (see part (d) of FIG. 8).
12 b (010_101_100_011)

In such a manner, in Embodiment 1, compressor 20 generates first compressed data d1 including the first flag value string and the first non-zero value string. The bit count of first compressed data d1 is 8 bits+12 bits=20 bits, which is less than the bit count of the weight data before compression.

Note that with the above example of the 32-bit data, the decrement in the bit count is all the same among Embodiment 1 and Comparative Examples 1 and 2, but the actual decrement in the bit count depends on the content of the data. The following describes how the bit count changes depending on the content of the data.

FIG. 9 is a diagram illustrating changes in the bit count before and after compression of ternary weight data according to Embodiment 1 and Comparative Examples 1 and 2. In FIG. 9, the bit count of ternary weight data before compression is denoted by A, and the bit count of compressed ternary weight data is denoted by a multiple of A. Note that in this example, the bit count of the ternary weight data before compression is set to be a multiple of 8 so as not to be disadvantageous to Comparative Example 2.

As illustrated in FIG. 9, with the compression method according to Comparative Example 1, the bit count of the flag value string can be reduced to A/2. In addition, with the compression method according to Comparative Example 1, the bit count of the non-zero value string can be reduced to 0 when the compression effect is the highest, and can be reduced to A/2 when the compression effect is the lowest. The bit count after compression according to Comparative Example 1 is the total of the bit count of the flag value string and the bit count of the non-zero value string, and is thus in the range of from A/2 to A.

With the compression method according to Comparative Example 2, the bit count can be reduced to A/2 when the compression effect is the highest, and the bit count becomes 2A when the compression effect is the lowest. The bit count after compression according to Comparative Example 2 is in the range of from A/2 to 2A.

In contrast, with the compression method according to Embodiment 1, the bit count of the first flag value string can be reduced to A/4. In addition, with the compression method according to Embodiment 1, the bit count of the non-zero value string can be reduced to 0 when the compression effect is the highest, and can be reduced to 3A/4 when the compression effect is the lowest. The bit count after compression according to Embodiment 1 is the total of the bit count of the first flag value string and the bit count of the first non-zero value string, and is thus in the range of from A/4 to A. Therefore, in Embodiment 1, the bit count after compression is less than that of Comparative Examples 1 and 2. In addition, although the bit count after compression may increase in Comparative Example 2, the bit count after compression does not increase in Embodiment 1.

As described above, with data compression device 10 according to the present embodiment, compressor 20 generates a 4-bit data string from the ternary weight data that is a data string of data items each having any one of three 2-bit values, and generates the first flag value string and the first non-zero value string based on the 4-bit data string. Accordingly, the data can be effectively compressed, and the bit count of the ternary weight data used in neural network 1 can be less than that of the conventional techniques.

The following describes the reason why the ternary weight data, which is a data string of data items each having any one of three 2-bit values, is converted into a 4-bit data string that is a data string of 4-bit data items each expressed as any one of nine 4-bit values. Specifically, the following describes the reason why the ternary weight data, which is a data string of data items each having three 2-bit values, is not converted into a 3-bit data string, a 5-bit data string, or the like.

FIG. 10 is a diagram illustrating the bit count necessary for expressing non-zero values included in the ternary weight data. FIG. 10 illustrates the case where the ternary weight data, which is a data string of data items each having any one of three 2-bit values, is virtually regarded as an N-bit data string (N is an integer greater than or equal to 2, or, if the bit count is less than N bits, a 1-bit data item 0 is added as many as the number necessary to reach N bits), and the state of a 1-bit flag is put into the case where 0 consecutively appears N times and the case where 0 does not consecutively appear N times and compression is performed accordingly. Here, "if the bit count is less than N bits, a 1-bit data item 0 is added as many as the number necessary to reach N bits" means, if the data string is not a data string of a multiple of N bits, a 1-bit data item 0 is added at the end of the data string so that the data string becomes the N-bit data string. FIG. 10 also illustrates a total number of variations of non-zero values included in the above-mentioned virtual N-bit weight data, and the bit count necessary for expressing such non-zero values. As illustrated in FIG. 10, when N is an odd number, the ternary weight data is virtually regarded as a data string of data items each having any one of $2^N$ N-bit values, and N bits are necessary to express $2^N-1$ variations of non-zero values that appear in the N-bit data string. When N is an even number, N=2M is assumed (M is an integer greater than or equal to 1), the ternary weight data is virtually regarded as a data string of data items each having any one of $3^M$ N-bit values, and at most N−1 bits are necessary to express $3^M-1$ variations of non-zero values that appear in the N-bit data string. Therefore, the compression effect can be generally enhanced by rounding up to the nearest even number rather than setting an odd number as N. Further, in the case where N is an even number, the condition of $3^M-1=2^{N-1}$ is mathematically satisfied when N=2 and when N=4, and thus there is no waste in the bits expressing non-zero values, but $3^M-1<2^{N-1}$ holds when N=6 and when N=8, and thus there is waste in the bits expressing non-zero values and the compression effect is low. For example, when N=8, 7 bits are necessary to express 80 variations of non-zero values, but since 7 bits, by nature, can express $2^7=128$ variations of non-zero values, the 7-bit non-zero values are said to contain a waste of 48 (=128−80) variations of non-zero values. Further, $3^M-1<2^{N-2}$ holds when N=10 or greater, and thus at most N−2 bits are sufficient to express non-zero values, but this is not realistic as a means of compression. For example, when N=10, the weight data is considered to have as many as 243 values, and thus, when a flag value string of a 1-bit flag is considered, the frequency of appearance of a flag value corresponding to the case where 0 consecutively appears N times becomes extremely low and the compression effect cannot be achieved. In addition, it is difficult to associate 242 variations of non-zero values with 8 bits. Therefore, in the case of virtually converting the ternary weight data, which is a data string of data items each having any one of three 2-bit values, into a data string of data items each having 3 bits or more, the ternary weight data is converted into, for example, a data string of 4-bit data items each expressed as any one of nine 4-bit values.

[1-2. Hardware Configuration]

Next, a hardware configuration of weight data compression device 10 according to the present embodiment will be described with reference to FIG. 11.

FIG. 11 is a diagram illustrating an example of a hardware configuration of computer 1000 that implements, by software, functions of weight data compression device 10 according to Embodiment 1.

Computer 1000 is a computer for compressing weight data. As illustrated in FIG. 11, computer 1000 includes input device 1001, output device 1002, CPU 1003, built-in storage 1004, RAM 1005, writing device 1006, reading device 1007, transmission/reception device 1008, and bus 1009. Input device 1001, output device 1002, CPU 1003, built-in storage 1004, RAM 1005, reading device 1007, and transmission/reception device 1008 are connected by bus 1009.

Input device 1001 is a user interface such as an input button, a touch pad, or a touch panel display, and accepts user operations. Note that input device 1001 may be configured to accept not only a user's contact operation but also a voice operation and/or a remote operation using a remote control, for example.

Output device 1002 is a device that outputs a signal from computer 1000, and may be not only a signal output terminal but also a user interface such as a display or a speaker.

Built-in storage 1004 is a flash memory or the like. Built-in storage 1004 may store, in advance, at least one of a program for implementing functions of weight data compression device 10 or an application using the functional configuration of weight data compression device 10.

RAM 1005 is random access memory and is used for storage of data or the like at the execution of a program or an application.

Reading device 1007 reads information from a recording medium such as universal serial bus (USB) memory. From a recording medium having the above-described program and/or application recorded thereon, reading device 1007 reads the program and/or application, and stores the program and/or application in built-in storage 1004.

Transmission/reception device 1008 is a communication circuit that performs wireless or wired communication. Transmission/reception device 1008 communicates with, for example, a server device connected to a network, downloads the above-described program and/or application from the server device, and stores the program and/or application in built-in storage 1004.

CPU 1003 is a central processing unit, copies the program, application, etc. stored in built-in storage 1004 to RAM 1005, and sequentially reads from RAM 1005 and executes instructions included in the copied program, application, etc. CPU 1003 performs compression processing on the weight data obtained from reading device 1007 or transmitting/receiving device 1008.

Writing device 1006 writes into memory the result of the operation performed by CPU 1003. The memory is located outside a semiconductor integrated circuit that executes processing of neural network 1, and first compressed data d1 resulting from the compression processing performed by CPU 1003 is stored in the memory.

[1-3. Weight Data Compression Method]

Next, the weight data compression method according to Embodiment 1 will be described with reference to FIG. 12.

FIG. 12 is a flowchart illustrating a flow of the weight data compression method according to Embodiment 1.

The weight data compression method according to the present embodiment is a method of compressing the weight data used in neural network 1, and includes generating a 4-bit data string and generating first compressed data d1.

First, compressor 20 generates a 4-bit data string which is a data string of 4-bit data items each expressed as any one of nine 4-bit values, by dividing the ternary weight data, which is a data string of data items each having any one of three 2-bit values as illustrated in part (a) of FIG. 8, into data items each having 4 bits as illustrated in part (b) of FIG. 8 (step S11).

Next, compressor 20 assigns one of (0) and (1) as a flag value of a 1-bit flag to a 4-bit data item (0000), and assigns the other (of (0) and (1)) as a flag value to each of 4-bit data items other than (0000) among the 4-bit data items in the 4-bit data string generated in step S11. Compressor 20 generates a first flag value string by assigning the flag values in this manner (step S12). In the present embodiment, (1) is assigned as a flag value to the 4-bit data item (0000), and (0) is assigned as a flag value to each of the 4-bit data items other than (0000) as illustrated in part (c) of FIG. 8.

Further, compressor 20 generates a first non-zero value string by converting each of the 4-bit data items other than (0000) into a 3-bit data item having any one of eight 3-bit values (step S13). The first non-zero value string is generated by converting each 4-bit data item into a 3-bit data item based on table T1 illustrated in part (e) of FIG. 8. With these steps S12 and S13, first compressed data d1 including the first flag value string and the first non-zero value string is generated (step S14). Note that the association between the eight 4-bit data items other than 0000 and the 3-bit data items each having any one of eight 3-bit values illustrated in table T1 is determined in advance before step S13 and is implemented in compressor 20.

Compressor 20 stores first compressed data d1 in the external memory located outside the semiconductor integrated circuit that performs the processing of neural network 1 (step S15).

By performing these steps S11 through S15, the ternary weight data is compressed and stored. Note that in step S11 of generating a 4-bit data string, there are cases where the total number of 2-bit data items into which the ternary weight data is divided is an odd number and the data item at the end of the weight data is not a 4-bit data item. In such cases, compressor 20 may generate a 4-bit data string by adding (00) at the end of the weight data and then dividing the weight data into data items each having 4 bits. However, since the total number of weights included in the weight data for each layer of the convolutional neural network is conventionally an even number, the total number of 2-bit data items into which the weight data is divided is generally an even number.

[1-4. Variation 1 of Embodiment 1]

A weight data compression method according to Variation 1 of Embodiment 1 will be described. Variation 1 describes an example of further performing the compression method according to Comparative Example 1 in addition to the compression method according to Embodiment 1, and selecting a compression method that yields a higher compression effect.

FIG. 13 is a flowchart illustrating the weight data compression method according to Variation 1 of Embodiment 1. The weight data compression method according to Variation 1 further includes, for example, generating a 2-bit data string and generating second compressed data d2, in addition to steps S11 through S14 described above. Steps other than steps S11 through S14 will be mainly described below.

After steps S11 through S14, compressor 20 generates a 2-bit data string by dividing the ternary weight data, which is a data string of data items each having any one of three 2-bit values illustrated in part (a) of FIG. 4, into data items each having 2 bits as illustrated in part (b) of FIG. 4 (step S21).

Next, compressor 20 generates a second flag value string by assigning (1) as a flag value of a 1-bit flag to a 2-bit data item (00) and assigning (0) as a flag value to each of 2-bit data items other than (00) or by assigning (0) as a flag value to the 2-bit data item (00) and assigning (1) as a flag value to each of the 2-bit data items other than (00) among the 2-bit data items in the 2-bit data string generated in step S21 (step S22). In the present variation, (1) is assigned as a flag value to the 2-bit data item (00), and (0) is assigned as a flag value to each of the 2-bit data items other than (00) as illustrated in part (c) of FIG. 4.

Further, compressor 20 generates a second non-zero value string by sequentially arranging data items corresponding to the 2-bit data items other than (00) as illustrated in part (d) of FIG. 4 (step S23). As a result, second compressed data d2 including the second flag value string and the second non-zero value string is generated (step S24).

Compressor 20 then compares the bit count of first compressed data d1 with the bit count of second compressed data d2, and stores the compressed data having a smaller bit count in the memory (step S25).

By performing these steps S11 through S14 and S21 through S25, the weight data is compressed more effectively. Note that steps S21 through S24 may be performed before steps S11 through S14, may be performed after steps S11 through S14, or may be performed in parallel with steps S11 through S14.

[1-5. Advantageous Effects, Etc.]

The weight data compression method according to the present embodiment is a weight data compression method of compressing ternary weight data used in a neural network, the weight data compression method including: generating a 4-bit data string by dividing the ternary weight data into data items each having 4 bits, the ternary weight data being a data string of data items each having any one of three 2-bit values, the 4-bit data string being a data string of 4-bit data items each expressed as any one of nine 4-bit values; and generating first compressed data including a first flag value string and a first non-zero value string by generating the first flag value string and the first non-zero value string, the first flag value string being generated by assigning one of 0 and 1 as a flag value of a 1-bit flag to a 4-bit data item 0000 and assigning an other (of 0 and 1) to a 4-bit data item other than 0000 among the 4-bit data items in the 4-bit data string, the first non-zero value string being generated by converting the 4-bit data item other than 0000 into a 3-bit data item having any one of eight 3-bit values.

Accordingly, it is possible to effectively compress data by generating the 4-bit data string from the ternary weight data, which is a data string of data items each having any one of three 2-bit values, and generating the first flag value string and the first non-zero value string based on the 4-bit data string generated. As a result, the bit count of the weight data used in neural network 1 can be less than that of the conventional techniques.

The weight data compression method may further include: associating eight 4-bit data items other than 0000 among the nine 4-bit values with 3-bit data items each having any one of the eight 3-bit values, wherein in the generating of first compressed data d1, the 4-bit data item other than 0000 is converted into a 3-bit data item having any one of the eight 3-bit values based on association between the eight 4-bit data items other than 0000 and the 3-bit data items each having any one of the eight 3-bit values.

According to this, the first non-zero value string can be appropriately generated, and the data can be effectively compressed. As a result, the bit count of the weight data used in neural network 1 can be less than that of the conventional techniques.

Further, the three 2-bit values may be 2-bit data items 00, 01, and 11, the nine 4-bit values may be 4-bit data items 0000, 0001, 0011, 0100, 0101, 0111, 1100, 1101, and 1111, and the eight 3-bit values may be 3-bit data items 000, 001, 010, 011, 100, 101, 110, and 111.

According to this, the first non-zero value string can be appropriately generated, and the data can be effectively compressed. As a result, the bit count of the weight data used in neural network 1 can be less than that of the conventional techniques.

Furthermore, the generating of the 4-bit data string may include adding 00 at an end of the ternary weight data and then dividing the ternary weight data into data items each having 4 bits, when a total number of 2-bit data items into which the ternary weight data is divided is an odd number.

As a result, the bit count of the weight data used in neural network 1 can be less than that of the conventional techniques.

The weight data compression method may further include: storing first compressed data d1 in external memory located outside a semiconductor integrated circuit that performs processing of neural network 1.

According to this, the amount of weight data to be stored in the semiconductor integrated circuit can be reduced, thus enabling reduction of the burden on the semiconductor integrated circuit.

Furthermore, the weight data compression method may further include: generating a 2-bit data string by dividing the ternary weight data into data items each having 2 bits, the ternary weight data being a data string of data items each having any one of three 2-bit values, the 2-bit data string being a data string of 2-bit data items each expressed as any one of three 2-bit values; generating second compressed data including a second flag value string and a second non-zero value string by generating the second flag value string and the second non-zero value string, the second flag value string being generated by assigning 1 as a flag value of a 1-bit flag to a 2-bit data item 00 and assigning 0 as a flag value to each of 2-bit data items other than 00 or by assigning 0 as a flag value to the 2-bit data item 00 and assigning 1 as a flag value to each of the 2-bit data items other than 00 among the 2-bit data items in the 2-bit data string, the second non-zero value string being generated by sequentially arranging data items corresponding to the 2-bit data items other than 00; and comparing a bit count of the first compressed data with a bit count of the second compressed data, and storing compressed data having a smaller bit count in memory.

By selecting the compressed data having a smaller bit count in such a manner, the bit count of the weight data used in neural network 1 can be less than that of the conventional techniques.

Furthermore, the storing may be performed for each of convolution layers of the neural network.

According to this, the bit count of the weight data used in each convolution layer can be less than that of the conventional techniques.

Weight data compression device 10 according to the present embodiment includes compressor 20 that compresses ternary weight data used in neural network 1. Compressor 20 generates a 4-bit data string by dividing the ternary weight data into data items each having 4 bits, the ternary weight data being a data string of data items each having any one of three 2-bit values, the 4-bit data string being a data string of 4-bit data items each expressed as any one of nine 4-bit values. Also, compressor 20 generates first compressed data d1 including a first flag value string and a first non-zero value string by generating the first flag value string and the first non-zero value string, the first flag value string being generated by assigning one of 0 and 1 as a flag value of a 1-bit flag to a 4-bit data item 0000 and assigning an other (of 0 and 1) to a 4-bit data item other than 0000 among the 4-bit data items in the 4-bit data string, the first non-zero value string being generated by converting the 4-bit data item other than 0000 into a 3-bit data item having any one of eight 3-bit values.

Accordingly, it is possible to effectively compress data since compressor 20 generates the 4-bit data string from the ternary weight data, which is a data string of data items each having any one of three 2-bit values, and generates the first flag value string and the first non-zero value string based on the 4-bit data string generated. As a result, the bit count of the weight data used in neural network 1 can be less than that of the conventional techniques.

Embodiment 2

[2-1. Weight Data Decompression Device]

FIG. 14 is a block diagram illustrating an outline of a functional configuration of weight data decompression device 50 according to Embodiment 2.

Weight data decompression device 50 (hereinafter also referred to as data decompression device 50) includes a processor such as a CPU, volatile memory, non-volatile memory, and a program stored in the non-volatile memory. The functional configuration of data decompression device 50 is implemented by executing the above program.

Data decompression device 50 includes decompression circuit 60 that decompresses first compressed data d1 compressed by data compression device 10. The compressed weight data compressed by data compression device 10 is input to decompression circuit 60. Decompression circuit 60 restores the compressed weight data to weight data before compression by decompressing the compressed weight data input to decompression circuit 60. The restored weight data is output to a layer of neural network 1. Hereinafter, the processing performed by decompression circuit 60 will be described.

FIG. 15 is a diagram illustrating a process by which weight data decompression device 50 decompresses the ternary weight data.

Decompression circuit 60 performs decompression processing on the first flag value string and the first non-zero value string included in first compressed data d1.

For example, the first flag value string is the data shown below (see part (a) of FIG. 15).
8 b (1_0_1_0_0_1_1_0)

For example, the first non-zero value string is the data shown below (see part (b) of FIG. 15).
12 b (010_101_100_011)

Decompression circuit 60 converts the 3-bit data items included in the first non-zero value string into 4-bit data items other than (0000) based on table T2 illustrated in part (d) of FIG. 15, and sequentially arranges the 4-bit data items other than (0000), Table T2 is a table in which 4-bit data items other than (0000) are associated with 3-bit data items each having any one of eight 3-bit values, and is implemented in decompression circuit 60. Table T2 is the same as table T1 used for compression. Decompression circuit 60 generates the 4-bit data items shown below through the above conversion (see part (c) of FIG. 15).

16 b (0100_1100_0001_0011)

Further, decompression circuit 60 generates data before compression by substituting a 4-bit data item for each flag value in the first flag value string illustrated in part (a) of FIG. 15. Specifically, decompression circuit 60 determines, for each flag value, whether the flag value is (0), and substitutes a 4-bit data item (0000) for one of flag values (0) and (1) included in the first flag value string, and substitutes a 4-bit data item other than (0000) for the other of flag values (0) and (1). That is to say, the decompression processing is performed with 4-bit granularity.

In the present embodiment, the 4-bit data item (0000) is substituted for flag value (1) and a 4-bit data item other than (0000) is substituted for flag value (0) based on information that is set in advance. Note that the 4-bit data item other than (0000) is the 4-bit data item obtained through the conversion performed based on table T2, and the substitution is performed in an order in which 3-bit data items each having any one of eight 3-bit values are converted into 4-bit data items other than (0000). With the above substitution, decompression circuit 60 generates weight data before compression as shown below (see part (e) of FIG. 15).

32 b (00000100000011000001000000000011)

As described above, with data decompression device 50 according to the present embodiment, decompression circuit 60 generates weight data before compression by generating a 4-bit data string based on the first non-zero value string and the first flag value string. According to this, the weight data that has been compressed to reduce the bit count can be effectively decompressed. In addition, with data decompression device 50, the decompression processing is performed with 4-bit granularity rather than 2-bit granularity as in Comparative Examples 1 and 2, and it is thus possible to reduce a total number of times the decompression processing is performed per unit time. This makes it possible to simplify the circuit configuration for performing the decompression processing.

[2-2. Hardware Configuration]

Next, a hardware configuration of weight data decompression device 50 according to the present embodiment will be described with reference to FIG. 16.

FIG. 16 is a diagram illustrating an example of a hardware configuration of computer 1500 that implements, by software, functions of weight data decompression device 50 according to Embodiment 2.

Computer 1500 is a computer for performing CNN processing. As illustrated in FIG. 16, computer 1500 includes input device 1001, output device 1002, CPU 1003, built-in storage 1004, RAM 1005, writing device 1006, reading device 1007, transmission/reception device 1008, and bus 1009. Input device 1001, output device 1002, CPU 1003, built-in storage 1004, RAM 1005, reading device 1007, and transmission/reception device 1008 are connected by bus 1009.

Input device 1001 is a user interface such as an input button, a touch pad, or a touch panel display, and accepts user operations. Note that input device 1001 may be configured to accept not only a user's contact operation but also a voice operation and/or a remote operation using a remote control, for example.

Output device 1002 is a device that outputs a signal from computer 1500, and may be not only a signal output terminal but also a user interface such as a display or a speaker.

Built-in storage 1004 is a flash memory or the like. Built-in storage 1004 may store, in advance, at least one of a program for implementing functions of weight data decompression device 50 or an application using the functional configuration of weight data decompression device 50.

RAM 1005 is random access memory such as double-data-rate (DDR) synchronous dynamic RAM, and is used for storage of data or the like at the execution of a program or an application. The weight data decompressed by CPU 1003 is stored in RAM 1005.

Transmission/reception device 1008 is a communication circuit that performs wireless or wired communication. Transmission/reception device 1008 communicates with, for example, a server device connected to a network, downloads the above-described program and/or application from the server device, and stores the program and/or application in built-in storage 1004.

Writing device 1006 writes information into a recording medium such as USB memory.

From a recording medium having the above-described program and/or application recorded thereon, reading device 1007 reads the program and/or application, and stores the program and/or application in built-in storage 1004.

Reading device 1007 also reads information from external memory. The external memory is located outside the semiconductor integrated circuit that executes processing of neural network 1. The external memory has first compressed data d1 stored therein. Reading device 1007 outputs the information read from the external memory to CPU 1003.

CPU 1003 is a central processing unit, copies the program, application, etc. stored in built-in storage 1004 to RAM 1005, and sequentially reads from RAM 1005 and executes instructions included in the copied program, application, etc. CPU 1003 in the present embodiment performs the decompression processing on first compressed data d1 obtained from the external memory.

[2-3. Weight Data Decompression Method]

Next, a weight data decompression method according to Embodiment 2 will be described with reference to FIG. 17.

FIG. 17 is a flowchart illustrating a flow of the weight data decompression method according to Embodiment 2.

The weight data decompression method according to Embodiment 2 is a method of decompressing first compressed data d1 compressed using the weight data compression method according to Embodiment 1.

First, decompression circuit 60 converts 3-bit data items included in the first non-zero value string illustrated in part (b) of FIG. 15 into 4-bit data items other than (0000), and sequentially arranges the 4-bit data items other than (0000) (step S51). The 3-bit data items are converted into the 4-bit data items based on table T2 illustrated in part (d) of FIG. 15. As a result, the 4-bit data items illustrated in part (c) of FIG. 15 are generated.

Next, decompression circuit 60 substitutes the 4-bit data item (0000) for one of flag values (0) and (1) included in the first flag value string illustrated in part (a) of FIG. 15, and substitutes a 4-bit data item other than (0000) for the other of flag values (0) and (1). In Embodiment 2, the 4-bit data item (0000) is substituted for flag value (1), and a 4-bit data item other than (0000) is substituted for flag value (0). The 4-bit data item other than (0000) is the 4-bit data item obtained through the conversion performed based on table T2, and the substitution is performed in an order in which 3-bit data items each having any one of eight 3-bit values are converted into 4-bit data items other than (0000). With the above substitution, decompression circuit 60 generates the weight data before compression as illustrated in part (e) of FIG. 15 (step S52). The restored weight data is used in matrix operations in each layer of neural network 1.

[2-4. Advantageous Effects, Etc.]

The weight data decompression method according to the present embodiment is a method of decompressing first compressed data d1 compressed using the weight data compression method according to Embodiment 1. The weight data decompression method according to the present embodiment includes: converting 3-bit data items included in the first non-zero value string into 4-bit data items other than 0000, and arranging the 4-bit data items other than 0000; and generating the ternary weight data before compression by substituting 0000 for the flag value of the one of 0 and 1 included in the first flag value string and substituting a 4-bit data item included in the 4-bit data items other than 0000 for the flag value of the other of 0 and 1 in an order in which the 4-bit data items other than 0000 are arranged.

As described above, since the ternary weight data before compression is generated by generating a 4-bit data string based on the first non-zero value string and the first flag value string, the ternary weight data which has been compressed to reduce the bit count can be effectively decompressed.

Weight data decompression device 50 according to the present embodiment includes decompression circuit 60 that decompresses first compressed data d1 compressed by weight data compression device 10. Decompression circuit 60: converts the first non-zero value string of 3-bit data items each having any one of eight 3-bit values into 4-bit data items other than 0000, and arranges the 4-bit data items other than 0000; and generates the ternary weight data before compression by substituting 0000 for the flag value of the one of 0 and 1 included in the first flag value string and substituting a 4-bit data item included in the 4-bit data items other than 0000 for the flag value of the other of 0 and 1 in an order in which the 4-bit data items other than 0000 are arranged.

As described above, since decompression circuit 60 generates the ternary weight data before compression by generating a 4-bit data string based on the first non-zero value string and the first flag value string, the ternary weight data which has been compressed to reduce the bit count can be effectively decompressed.

Embodiment 3

A weight data compression method and a weight data decompression method according to Embodiment 3 will be described. The present embodiment describes an example of performing 4-bit integer (INT4) compression and decompression.

FIG. 18 is a diagram illustrating weight data compression processing and decompression processing performed in Embodiment 3.

The weight data compression method according to Embodiment 3 is a zero value compression (ZVC) method. In Embodiment 3, too, the weight data before compression is assumed as follows (see part (a) of FIG. 18):
32 b (00000100000011000001000000000011)

First, a 4-bit data string is generated by dividing the 32-bit weight data into data items each having 4 bits (see part (b) of FIG. 18).
32 b (0000_0100_0000_1100_0001_0000_0000_0011)

Here, flag value (1) is assigned to the 4-bit data item (0000), and flag value (0) is assigned to each of 4-bit data items other than (0000) among the 4-bit data items in the 4-bit data string. Doing so generates a flag value string of 8-bit data shown below (see part (c) of FIG. 18).
8 b (1_0_1_0_0_1_1_0)

The above flag value string shows that there is a zero value, i.e., the 4-bit data item (0000), at each position of flag value (1), and that there is a non-zero value, i.e., a 4-bit data item other than (0000), at each position of flag value (0).

Here, to the 4-bit data item other than (0000), the same 4-bit data item other than (0000) is assigned as-is. By doing so, a non-zero value string in which the 4-bit data items other than (0000) are sequentially arranged is expressed as data shown below (see part (d) of FIG. 18).
16 b (0100_1100_0001_0011)

The compressed data compressed in this manner is stored in external memory.

The weight data decompression method according to Embodiment 3 is a method of decompressing the data compressed using the above-described weight data compression method. This weight data decompression method can use data decompression device 50 described in Embodiment 2.

First, data decompression device 50 substitutes (0000) for flag value (1) included in the flag value string illustrated in part (c) of FIG. 18, and substitutes a 4-bit data item other than (0000) as-is for flag value (0). That is to say, the decompression processing is performed with 4-bit granularity. With the above substitution, the weight data before compression shown below is generated (see part (e) of FIG. 18).
32 b (00000100000011000001000000000011)

The restored weight data is used in matrix operations in each layer of neural network 1.

In such a manner, data decompression device 50 can also decompress the data compressed through the 4-bit integer (INT4) compression.

Embodiment 4

A weight data compression method and a weight data decompression method according to Embodiment 4 will be described. The present embodiment describes an example of performing 8-bit integer (INT8) compression and decompression.

FIG. 19 is a diagram illustrating weight data compression processing and weight data decompression processing performed in Embodiment 4.

The weight data compression method according to Embodiment 4 is a zero value compression (ZVC) method. The present embodiment describes an example in which the weight data before compression is 80-bit data illustrated in part (a) of FIG. 19.

When the 80-bit data illustrated in part (a) of FIG. 19 is divided into data items each having 8 bits, the 80-bit data is expressed as an 8-bit data string illustrated in part (b) of FIG. 19.

In Embodiment 4, flag value (1) is assigned to an 8-bit data item (00000000), and flag value (0) is assigned to each of 8-bit data items other than (00000000) among the 8-bit data items in the 8-bit data string. Doing so generates a flag value string of 10-bit data as illustrated in part (c) of FIG. 19. This flag value string shows that there is a zero value, i.e., (00000000), at each position of flag value (1), and that there is a non-zero value, i.e., an 8-bit data item other than (00000000), at each position of flag value (0).

In Embodiment 4, to an 8-bit data item other than (00000000), the same 8-bit data item other than (00000000) is assigned as-is. By doing so, a non-zero value string in which 8-bit data items other than (00000000) are sequentially arranged is expressed as data illustrated in part (d) of FIG. 19. The data compressed through the above compression processing is stored in external memory.

The weight data decompression method according to Embodiment 4 is a method of decompressing the data compressed using the above-described weight data compression method. This weight data decompression method also can use data decompression device 50 described in Embodiment 2.

First, data decompression device 50 substitutes the 8-bit data item (00000000) for flag value (1) included in the flag value string illustrated in part (c) of FIG. 19, and substitutes an 8-bit data item other than (00000000) as-is for flag value (0). That is to say, the decompression is performed with 8-bit granularity. With the above substitution, the weight data before compression as illustrated in part (e) of FIG. 19 is generated. The restored weight data is used in matrix operations in each layer of neural network 1.

In such a manner, data decompression device 50 can also decompress the data compressed through the 8-bit integer (INT8) compression.

Other Embodiments

While the weight data compression method and so on according to the present disclosure have been described above based the above embodiments, the present disclosure is not limited to these embodiments. The scope of the present disclosure also encompasses embodiments achieved by making various modifications to the above embodiments that are conceivable by a person of skill in the art, as well as other embodiments resulting from combination of some constituent elements from the above embodiments, so long as such embodiments are within the essence of the present disclosure.

In addition, one or more aspects of the present disclosure may also encompass the following embodiments:

(1) A part of the constituent elements included in the above-described weight data compression device and weight data decompression device may be implemented as a computer system including a microprocessor, ROM, RAM, a hard disk unit, a display unit, a keyboard, and a mouse, for example, A computer program is stored in the RAM or the hard disk unit. A function is achieved as a result of the microprocessor operating according to the computer program. Here, the computer program is configured by combining a plurality of instruction codes indicating instructions to be given to the computer in order to achieve a given function.

(2) A part of the constituent elements of the above-described weight data compression device and weight data decompression device may be configured from one system large-scale integrated circuit (LSI). A system LSI is manufactured with a plurality of components integrated on a single chip, and is specifically a computer system including a microprocessor, ROM, and RAM, for example. A computer program is stored in the RAM. The system LSI circuit achieves its function as a result of the microprocessor operating according to the computer program.

(3) A part of the constituent elements of the above-described weight data compression device and weight data decompression device may be configured as an IC card that is detachably attached to each device, or as a stand-alone module. The IC card and the module are computer systems configured from a microprocessor, ROM, and RAM, for example. The IC card and the module may include the LSI described above. The IC card and the module achieve their function as a result of the microprocessor operating according to a computer program. The IC card and the module may be tamperproof.

(4) A part of the constituent elements of the above-described weight data compression device and weight data decompression device may also be implemented as the computer program or a digital signal recorded on a computer-readable recording medium, such as a flexible disk, a hard disk, CD-ROM, a magneto-optical disk (MO), a digital versatile disc (DVD), DVD-ROM, DVD-RAM, a Blu-ray (registered trademark) disc (BD), or a semiconductor memory. It may also be implemented as the digital signal recorded on the above mentioned recording media.

Moreover, a part of the constituent elements of the above-described weight data compression device and weight data decompression device may also be implemented by transmitting the computer program or the digital signal via, for example, an electric communication line, a wireless or wired communication line, a network such as the Internet, or data broadcasting.

(5) The present disclosure may be implemented as the methods described above. In addition, the present disclosure may also be implemented as a computer program that realizes such methods with a computer, or as a digital signal including the computer program. Moreover, the present disclosure may also be implemented as a non-transitory computer-readable recording medium such as CD-ROM having the computer program recorded thereon.

(6) Moreover, the present disclosure may be implemented as a computer system including (i) memory having the computer program stored therein and (ii) a microprocessor that operates according to the computer program.

(7) Moreover, the program or the digital signal may be implemented by another independent computer system by being recorded on the recording media and transmitted, or by being transmitted via the network, for example.

(8) The above embodiments and variation may be individually combined.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to an image processing method or the like as a method for implementing a neural network in a computer or the like.

The invention claimed is:

1. A weight data compression method of compressing ternary weight data used in a neural network, the weight data compression method comprising:

generating a 4-bit data string by dividing the ternary weight data into data items each having 4 bits, the ternary weight data being a data string of data items each having any one of three 2-bit values, the 4-bit data string being a data string of 4-bit data items each expressed as any one of nine 4-bit values; and generating first compressed data including a first flag value string and a first non-zero value string by generating the first flag value string and the first non-zero value string, the first flag value string being generated by assigning one of 0 and 1 as a first flag value of a 1-bit flag to a 4-bit data item 0000 and assigning an other of 0 and 1 as a second flag of the 1-bit flag to a 4-bit data item other than 0000 among the 4-bit data items in the 4-bit data string, the first non-zero value string being generated by converting the 4-bit data item other than 0000 into a 3-bit data item having any one of eight 3-bit values.

2. The weight data compression method according to claim 1, further comprising:
associating eight 4-bit data items other than 0000 among the nine 4-bit values with 3-bit data items each having any one of the eight 3-bit values,
wherein in the generating of the first compressed data, the 4-bit data item other than 0000 is converted into a 3-bit data item having any one of the eight 3-bit values based on association between the eight 4-bit data items other than 0000 and the 3-bit data items each having any one of the eight 3-bit values.

3. The weight data compression method according to claim 1,
wherein the three 2-bit values are 2-bit data items 00, 01, and 11,
the nine 4-bit values are 4-bit data items 0000, 0001, 0011, 0100, 0101, 0111, 1100, 1101, and 1111, and
the eight 3-bit values are 3-bit data items 000, 001, 010, 011, 100, 101, 110, and 111.

4. The weight data compression method according to claim 2,
wherein the three 2-bit values are 2-bit data items 00, 01, and 11,
the nine 4-bit values are 4-bit data items 0000, 0001, 0011, 0100, 0101, 0111, 1100, 1101, and 1111, and
the eight 3-bit values are 3-bit data items 000, 001, 010, 011, 100, 101, 110, and 111.

5. The weight data compression method according to claim 1,
wherein the generating of the 4-bit data string includes adding 00 at an end of the ternary weight data and then dividing the ternary weight data into data items each having 4 bits, when a total number of 2-bit data items into which the ternary weight data is divided is an odd number.

6. The weight data compression method according to claim 2,
wherein the generating of the 4-bit data string includes adding 00 at an end of the ternary weight data and then dividing the ternary weight data into data items each having 4 bits, when a total number of 2-bit data items into which the ternary weight data is divided is an odd number.

7. The weight data compression method according to claim 3,
wherein the generating of the 4-bit data string includes adding 00 at an end of the ternary weight data and then dividing the ternary weight data into data items each having 4 bits, when a total number of 2-bit data items into which the ternary weight data is divided is an odd number.

8. The weight data compression method according to claim 4,
wherein the generating of the 4-bit data string includes adding 00 at an end of the ternary weight data and then dividing the ternary weight data into data items each having 4 bits, when a total number of 2-bit data items into which the ternary weight data is divided is an odd number.

9. The weight data compression method according to claim 1, further comprising:
storing the first compressed data in external memory located outside a semiconductor integrated circuit that performs processing of the neural network.

10. The weight data compression method according to claim 1, further comprising:
generating a 2-bit data string by dividing the ternary weight data into data items each having 2 bits, the ternary weight data being a data string of data items each having any one of three 2-bit values, the 2-bit data string being a data string of 2-bit data items each expressed as any one of three 2-bit values;
generating second compressed data including a second flag value string and a second non-zero value string by generating the second flag value string and the second non-zero value string, the second flag value string being generated by assigning, as two flag values of a 1-bit flag, 1 to a 2-bit data item 00 and 0 to each of 2-bit data items other than 00 or by assigning, as the two flag values of the 1-bit flag, 0 to the 2-bit data item 00 and 1 to each of the 2-bit data items other than 00 among the 2-bit data items in the 2-bit data string, the second non-zero value string being generated by sequentially arranging data items corresponding to the 2-bit data items other than 00; and
comparing a bit count of the first compressed data with a bit count of the second compressed data, and storing compressed data having a smaller bit count in memory.

11. The weight data compression method according to claim 10,
wherein the storing is performed for each of convolution layers of the neural network.

12. A weight data decompression method of decompressing the first compressed data compressed using the weight data compression method according to claim 1, the weight data decompression method comprising:
converting 3-bit data items included in the first non-zero value string into 4-bit data items other than 0000, and arranging the 4-bit data items other than 0000; and
generating the ternary weight data before compression by substituting 0000 for a flag value of the one of 0 and 1 included in the first flag value string and substituting a 4-bit data item included in the 4-bit data items other than 0000 for a flag value of the other of 0 and 1 in an order in which the 4-bit data items other than 0000 are arranged.

13. A weight data compression device comprising:
a compressor that compresses ternary weight data used in a neural network,
wherein the compressor:
generates a 4-bit data string by dividing the ternary weight data into data items each having 4 bits, the ternary weight data being a data string of data items each having any one of three 2-bit values, the 4-bit data string being a data string of 4-bit data items each expressed as any one of nine 4-bit values; and
generates first compressed data including a first flag value string and a first non-zero value string by generating the first flag value string and the first non-zero value string, the first flag value string being generated by assigning one of 0 and 1 as a first flag value of a 1-bit flag to a 4-bit data item 0000 and assigning an other of 0 and 1 as a second flag value of the 1-bit flag to a 4-bit data item other than 0000 among the 4-bit data items in the 4-bit data string, the first non-zero value string being generated by converting the 4-bit data item other than 0000 into a 3-bit data item having any one of eight 3-bit values.

14. A weight data decompression device comprising:
a decompression circuit that decompresses the first compressed data compressed by the weight data compression device according to claim 13,
wherein the decompression circuit:
   converts the first non-zero value string of 3-bit data items each having any one of eight 3-bit values into 4-bit data items other than 0000, and arranges the 4-bit data items other than 0000; and
   generates the ternary weight data before compression by substituting 0000 for a flag value of the one of 0 and 1 included in the first flag value string and substituting a 4-bit data item included in the 4-bit data items other than 0000 for a flag value of the other of 0 and 1 in an order in which the 4-bit data items other than 0000 are arranged.

* * * * *